US011493544B2

(12) United States Patent
Jeong

(10) Patent No.: US 11,493,544 B2
(45) Date of Patent: Nov. 8, 2022

(54) ELECTRONIC ELECTRICITY METER

(71) Applicant: Tae Jun Yoon, Yongin-si (KR)

(72) Inventor: Yeon Moon Jeong, Yongin-si (KR)

(73) Assignee: Yeon Moon Jeong, Yongin-si (KR)

( * ) Notice: Subject to any disclaimer, the term of this patent is extended or adjusted under 35 U.S.C. 154(b) by 41 days.

(21) Appl. No.: 16/957,308

(22) PCT Filed: Dec. 6, 2018

(86) PCT No.: PCT/KR2018/015393
§ 371 (c)(1),
(2) Date: Jun. 23, 2020

(87) PCT Pub. No.: WO2019/216512
PCT Pub. Date: Nov. 14, 2019

(65) Prior Publication Data
US 2021/0364558 A1    Nov. 25, 2021

(30) Foreign Application Priority Data

May 8, 2018  (KR) .......................... 10-2018-0052534

(51) Int. Cl.
*G01R 22/06* (2006.01)
*H02M 3/158* (2006.01)
(Continued)

(52) U.S. Cl.
CPC ........ *G01R 22/063* (2013.01); *H02M 3/1582* (2013.01); *H02M 7/06* (2013.01); *H03K 5/24* (2013.01)

(58) Field of Classification Search
None
See application file for complete search history.

(56) References Cited

U.S. PATENT DOCUMENTS

2019/0386504 A1* 12/2019 Yao .................. H02J 13/00032

FOREIGN PATENT DOCUMENTS

JP   2000-217244    8/2000
JP   2008-261663    10/2008
(Continued)

OTHER PUBLICATIONS

International Search Report, with English translation, corresponding to International Application No. PCT/KR2018/015393, dated Mar. 11, 2019.

*Primary Examiner* — Jas A Sanghera
(74) *Attorney, Agent, or Firm* — Kile Park Reed & Houtteman PLLC

(57) ABSTRACT

Provided is an electronic electricity meter. Since inductive power from a magnetic field surrounding a transmission line is generated using a current transformer, and the inductive power is stored to be used as a driving power source for the electricity meter, the present invention can prevent power from being consumed by the electricity meter in an unloaded state. In addition, the present invention can protect the electricity meter from a surge voltage, lightening, or the like by insulating the transmission line and internal components from each other. In addition, when a power cut-off instruction is received from the electrical energy measurement server, the present invention can cut off power supply to a load by turning off a switch in a power source cut-off unit installed on the transmission line, and when a power supply instruction is received from the server, can remotely control power supply to the load.

7 Claims, 2 Drawing Sheets

(51) Int. Cl.
*H02M 7/06* (2006.01)
*H03K 5/24* (2006.01)

(56) References Cited

FOREIGN PATENT DOCUMENTS

| | | |
|---|---|---|
| JP | 2011-047720 | 3/2011 |
| KR | 20-0430812 | 11/2006 |
| KR | 10-2013-0087838 | 8/2013 |
| KR | 10-1452751 | 10/2014 |
| KR | 10-2022024 | 9/2019 |

\* cited by examiner

ELECTRONIC ELECTRICITY METER

CROSS-REFERENCE TO RELATED APPLICATIONS

This application is a national entry of International Application No. PCT/KR2018/015393, filed on Dec. 6, 2018, which claims priority to Korean Patent Application No. 10-2018-0052534 under 35 U.S.C. § 119, filed on May 8, 2018, the entire contents of which are hereby incorporated by reference.

TECHNICAL FIELD

The present invention relates to an electricity meter, and more particularly, to an electronic electricity meter.

BACKGROUND ART

Generally, an electronic electricity meter widely used in industries is composed of various electrical and electronic elements to convert analog data of a voltage and a current into digital data, calculate power using the digital data, and accumulate power changes according to time flows to measure electrical energy.

A procedure in which analog voltage data is converted into digital data is to step down several tens or hundreds of volts to several volts, for which digital conversion is possible, using a voltage divider circuit composed of resistors. A procedure in which analog current data is converted into digital data is to transform a high current to a low current using a current transformer, convert the transformed current into a voltage using a resistor, and convert this signal into a digital one using an analog-to-digital converter. The typical configuration of the electronic electricity meter is to calculate such converted data and represent the calculated result digitally.

FIG. 1 illustrates a fundamental configuration of a typical electronic electricity meter.

The typical electronic electricity meter includes a power source circuit unit 10, a power measurement unit 20, and a digital circuit unit 30.

The power source circuit unit 10 is connected to a commercial power source, receives AC power from the commercial power source, converts the AC power into DC power required for various kinds of electronic components in the electricity meter, provides the DC power to the electronic components, and is composed of a power source circuit 11 of a switching-mode power source (SMPS) type.

The power measurement unit 20 is composed of a voltage signal detection unit 21, a current signal detection unit 22, a voltage A/D conversion unit 24, a current A/D conversion unit 23, and a measurement unit 25. The voltage signal detection unit 21 is connected with power source sides 1S and 2S in parallel to receive a voltage to be provided to a load side 1L, and the current signal detection unit 22 is serially connected to the power side 1S to receive a current to be provided to the load side 1L. The detection units 21 and 22 respectively convert the applied voltage and current into fine voltage signals, and then output the voltage signals to the voltage A/D conversion unit 24 and the current A/D conversion unit 23.

The voltage A/D conversion unit 24 and the current A/D conversion unit 23 convert the input analog signals to digital signals to output the digital signals to the measurement unit 25, and the measurement unit 25 multiplies the digital signals corresponding to the voltage and current by each other to calculate power in watt, and then outputs a "watt" value as raw data, or a signal proportional to the power to a central processing unit (CPU) 31 of the digital circuit unit 20.

The digital circuit unit 30 is composed of the CPU 31, an oscillation circuit 33, a non-volatile memory 34, a communication circuit 35, and an LCD display 37.

The CPU 31 of the digital circuit unit 30 continuously accumulates "watt" values, which are raw data input from the power measurement unit 20, or signals proportional to the power to calculate the electrical energy (kWh).

The oscillation circuit 33 is used as an oscillator required for operating the CPU 31, and the non-volatile memory 34 stores data measured and calculated by the CPU 31. The communication circuit 35 performs a communication with an external electrical energy measurement server through an external computer or a communication network to transmit the stored information in the non-volatile memory 34. The LCD display 37 displays the electrical energy accumulated in real time.

Meanwhile, since such a typical electronic electricity meter directly receives power for driving the electricity meter from a commercial power source, the power is continuously consumed and the charging is performed even when the power is not used in a household or company.

In addition, since the electricity meter is directly connected to a power line to receive the power, a power source circuit inside the electricity meter is easily damaged by a change in temperature and humidity, or an incoming surge voltage (lightening or the like) to cause a serious issue in durability of the electricity meter.

In addition, the typical electronic electricity meter only performs a remote reading service on a level that the measured electrical energy is unidirectionally transmitted to an electrical energy measurement server through a communication circuit, and does not provide a service beyond that.

Disclosure of the Invention Technical Problem

The present invention provides an electronic electricity meter that can prevent power consumption of the electricity meter itself in an unloaded state, be protected from an external impact such as lightening or a surge voltage, and provide various remote reading services.

Technical Solution

In accordance with an embodiment of the present invention, an electronic electricity meter includes: one or more current transformers for generating power using a magnetic field around a transmission line; one or more comparators respectively connected to the transformers, and for outputting comparison signals indicating voltages input from the transformers; a buck/boost converter for boosting or stepping down a voltage supplied from any one among the one or more current transformers; a power storage unit charged with a voltage output from the buck/boost converter; an interface unit driven with a driving voltage VDD supplied from the buck/boost converter or the power storage unit, for generating a driving voltage SVDD of a transceiver to drive the transceiver, outputting data received from an electrical energy measurement server to a main control unit through the transceiver, and for transmitting data received from the main control unit to the electrical energy measurement server through the transceiver; the transceiver for transmitting the data input from the interface unit to the electrical energy measurement server, outputting the data received from the electrical measurement server to the main control unit, and including a display for displaying electrical energy; and the main control unit for checking the voltage output from the buck/boost converter to control the buck/boost converter to boost or step down the voltage input thereto, receiving the comparison signals from the one or more comparators to determine whether a current state is an unloaded state or a blackout state, and performing a power saving control operation according to the determined current state.

The main control unit may check a charged state of the power storage unit, when the current state is determined to be the unloaded state, and may operate an internal electrical energy counter in a sleep mode, turn off a display of the transceiver, and turn on or off a communication function of the transceiver in a constant time period, when the electrical energy stored in the power storage unit has a level equal to or smaller than a reference level preset in advance.

When the current state is the blackout state, the main control unit may output a black out signal to the transceiver through the interface unit to allow the transceiver to transmit the black out signal to the electrical energy measurement server, and output a HALT signal to the interface unit to allow the interface unit to stop a supply of a driving power voltage SVDD for driving the transceiver so as to turn off the transceiver and the display.

The electronic electricity meter may further include a power source cut-off unit installed between the commercial power source and a load and for cutting off or resuming power supply from the commercial power source to the load, wherein, the main control unit may control the power source cut-off unit to cut off the power supply from the commercial power source to the load side, when a power cut-off instruction is received from an electrical energy measurement server through the interface unit, and may control the power source cut-off unit to resume the power supply from the commercial power source to the load, when a power supply instruction is received from the electrical energy server through the interface unit.

The transceiver may receive the power cut-off instruction and the power supply instruction from the electrical energy measurement server or an external electronic device to output the power cut-off instruction and the power supply instruction to the interface unit.

The electronic electricity meter may further include: an AC power monitoring sensor for measuring a voltage and a current of the power flowing from the commercial power source to the load to output a measurement value ACPM; and an AC power monitoring unit composed in a structure in which an input side connected to the AC power monitoring sensor and an output side connected to the main control unit are insulated from each other, and for outputting an AC power measurement value ACPM input from the AC power monitoring sensor to the main control unit, wherein the main control unit may measure electrical energy consumed by the load using the AC power measurement value ACPM, accumulate and stores the measured electrical energy, and output electrical energy data to the interface unit to show the electrical energy data on a display included in the transceiver.

The main control unit may control the buck/boost converter to operate as a buck converter, when the voltage input to the buck/boost converter is higher than a rated voltage of the power storage unit, and may control the buck/boost converter to operate as a boost converter, when the voltage input to the buck/boost converter is lower than a rated voltage of the power storage unit.

Advantageous Effects

According to the present invention, since inductive power from a magnetic field surrounding a transmission line is generated using a current transformer and the inductive power is stored to be used as driving power for an electricity meter, the power can be prevented from being consumed by the electricity meter in an unloaded state.

In addition, the present invention can protect the electricity meter from a surge voltage, lightening, or the like by insulating the transmission line and internal components from each other.

In addition, when a power cut-off instruction is received from an electrical energy measurement server, the present invention can remotely cut off power from being supplied to a load side by turning off a switch of a power source cut-off unit installed on the transmission line. And, when a power supply instruction is received from the electrical energy measurement server, the present invention can remotely supply power to the load side by turning on the switch of the power source cut-off unit installed on the transmission line.

MODE FOR CARRYING OUT THE INVENTION

Hereinafter, it will be described in detail about an exemplary embodiment of the present invention with reference to the accompanying drawing.

Figure 1:
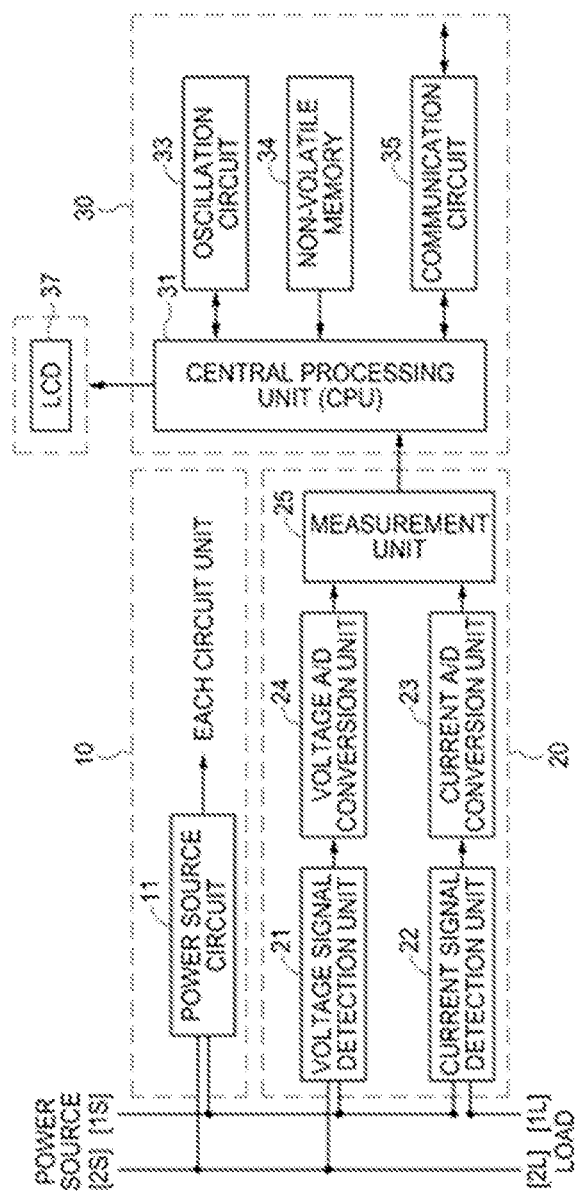
FIG. 1 illustrates the fundamental configuration of a typical electronic electricity meter.
Figure 2:
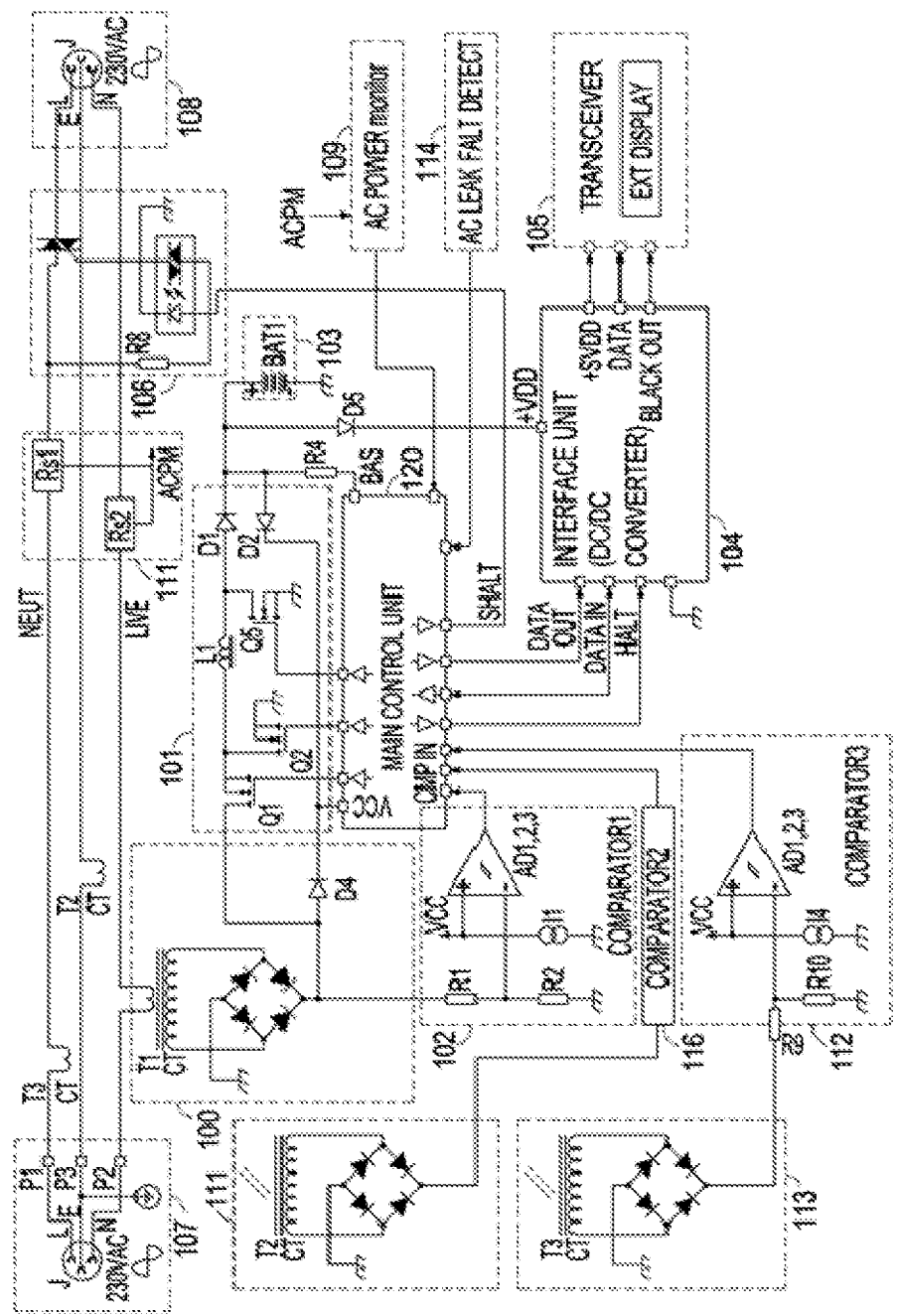
FIG. 2 illustrates the configuration of an electronic electricity meter according to a preferred embodiment of the present invention.

FIG. 2 illustrates the configuration of an electronic electricity meter according to a preferred embodiment of the present invention.

With reference to FIG. 2, the electronic electricity meter according to a preferred embodiment of the present invention includes one or more current transformers 100, 111, and 113, comparator 1 to 3 102, 116, and 112 corresponding to the current transformers 100, 111, and 113, a buck/boost converter 101, a power source cut-off unit 106, an AC power monitoring sensor 110, an AC leak fault detector 114, an AC power monitoring unit 109, an interface unit 104, a transceiver 105 including an external display, a power storage unit 103, and a main control unit 120.

The one or more current transformer 100, 111, and 113 are installed around the transmission line through which a current flows towards the load 108 from a commercial power source side, generates an AC voltage through a change in magnetic field generated around the transmission line, and rectifies and outputs the AC voltage to the comparators 1 to 3 102, 116, and 112. The current transformers 100, 111, and 113 are well-known components, and thus detailed descriptions thereabout will be omitted. In particular, one 100 among the one or more current transformers 100, 111, and 113 outputs a rectified voltage to the comparator 102, and also to the buck/boost converter 101 and the main control unit 120.

The one or more comparators 1 to 3 102, 116, and 112 are supplied with DC voltages from the respective current transformers 100, 111, and 113, compare the voltages input from the current transformers 100, 111, and 113 with a reference voltage, and output comparison signals that show the differences with the reference voltage to respective CMI IN terminals of the main control unit 120.

The buck/boost converter 101 boosts or steps down the DC voltage input from the current transformers 100, 111, and 113, and output the result according to a control signal of the main control unit 120. For reference, the main control unit 120 controls the buck/boost converter 101 to operate as a buck converter, when a voltage input to the buck/boost converter 101 is higher than a rated voltage of the power storage unit 103, and controls the buck/boost converter 101 to operate as a boost converter, when the voltage input to the buck/boost converter 101 is lower than the rated voltage of the power storage unit 103.

The power storage unit 103 is implemented with a secondary cell or a super capacitor. Therefore, when the voltage is input from the buck/boost converter 101, the power storage unit 103 is charged using the input voltage to store the power. When the voltage is not output from the buck/boost converter 101, the power storage unit 103 discharges the charged voltage and supplies driving power to the main control unit 120 and the interface unit 104.

The power source cut-off unit 106 cuts off or resumes power supply by turning on or off a switch installed between the commercial power source 107 and the load 108 by means of a control signal (system halt (SHALT)) input from the main control unit 120. The power source cut-off unit 106 can be implemented with various electrical elements and mechanical elements such as a triac switch, a solenoid switch, a relay switch, or the like.

The AC leak fault detector 114 detects a ground fault current for an AC load to output the same to the main control unit 120, and the main control unit 120 operates the power source cut-off unit 106 at the time of occurrence of abnormality to cut off power supply, and thus prevent an issue caused by an electric shock or an electrical leakage.

The AC power monitoring sensor 110 measures a voltage and a current of the power flowing from the commercial power source 107 towards the load 108 to generate a measurement value ACPM, and outputs the measurement value ACPM to the AC power monitoring unit 109.

The AC power monitoring unit 109 is composed in a structure in which an input side connected to the AC power monitoring sensor 110 such as a photo coupler or a transformer is insulated from an output side connected to the main control unit 120, and thus, the AC power measurement value input from the AC power monitoring sensor 110 is output to the main control unit 120. For reference, the main control unit 120 measures an electrical energy consumed in the load 108 from the voltage and current measured in the AC power monitoring sensor 110, accumulates and stores the measured electrical energy, outputs electrical energy data to the interface unit 104 to display the electrical energy data on a display included in the transceiver 105, and transmits the electrical energy data to an electrical energy measurement server (not shown) in a constant time period or in real time.

The interface unit 104 is driven by a power source voltage VDD supplied from the buck/boost converter 101 or the power storage unit 103, includes a DC/DC converter therein to supply the driving power source voltage SVDD to the transceiver 105 including a display, outputs an instruction (e.g., a power cut-off instruction, a power supply instruction, or the like) input from the transceiver 105 to the main control unit 120, and outputs data input from the main control unit 120 (e.g., an accumulated power consumption amount or the like) and a black out signal to the transceiver 105 to deliver them to the power measurement server (not shown).

The transceiver 105 is provided with a communication function to perform a communication with the electrical energy measurement server, transmits the electrical energy data input from the interface unit 104, the current state data (e.g., a black out signal, an unloaded state signal, or the like), or the like to the electrical energy measurement server (not shown), outputs the power cut-off instruction or the power supply instruction received from the electrical energy measurement server to the main control unit 120 so as to cut off power to the load 108 or to supply power having been cut off thereto. In addition, the transceiver 105 includes a display therein, and outputs the accumulated electrical energy received from the main control unit 120 in real time through the interface unit 104. Furthermore, the transceiver 105 directly performs a communication with an external electronic device (not shown) carried by a meter reader through an RFID or another wireless communication means, receives the power cut off instruction or the power supply instruction from the external device to output the received instruction to the main control unit 120, and thus allows the main control unit 120 to cut off power to the load 108 or to supply power having been cut off thereto.

The main control unit 120 is supplied with power from the buck/boost converter 101 or the power storage unit 103 to be driven, compares comparison signals with each other, which are input through the CMP IN terminals from the one or more comparators 1 to 3 102, 116, and 112, and determines whether it is an unloaded state in which the load 108 does not use power, or a blackout state in which the commercial power source 107 does not supply power towards the load 108.

In addition, when it is currently in the unloaded state and the electrical energy stored in the power storage unit 103 is equal to or smaller than a reference level set in advance, the main control unit 120 operates an internal electrical energy counter (not shown) in a sleep mode to reduce power consumption, turns off the display included in the transceiver 105 to save power consumption, and turns on or off the communication function of the transceiver 105 in a certain time period to minimize power consumption.

Furthermore, when it is currently in the blackout state, the main control unit 120 transmits a black out signal to the electrical energy measurement server (not shown) through the interface unit 104 and the transceiver 105, and then outputs a HALT signal to the interface unit 104 so as to cut off power supply to the transceiver 105.

The entire functions of the components have been described. Hereinafter, the operation of the electronic electricity meter according to the present invention will be described in turn, and the function of each of the components will be described more specifically.

First, when AC power is supplied from the commercial power source 107 towards the load 108, magnetic fields are formed around transmission lines, and the current transformers 100, 111, and 113 generate AC power using the magnetic fields respectively formed around the transmission lines, and transform the AC power to DC power to output to the comparators 102, 116, and 112.

Meanwhile, any one current transformer 100 among the plurality of current transformers 100, 111, and 113 outputs the generated power to the comparator 102, the buck/boost converter 101, and a VCC terminal of the main control unit 120, and the main control unit 120 is driven with the power input from the current transformer 100.

The voltage input from the current transformer 100 is boosted or stepped down through the buck/boost converter 101 to be output to the power storage 103, and the power storage 103 is charged with the voltage input from the buck/boost converter 101. Here, the interface unit 104 is supplied with the power source voltage VDD from the buck/boost converter 101, and the DC/DC converter inside the interface unit 104 performs conversion on the voltage input from the buck/boost converter 101 to provide the driving power source voltage SVDD of the interface unit 104.

Here, the voltage output through the buck/boost converter 101 is input to the main control unit 120 through a BAS terminal of the main control unit 120, and according to the voltage input to the BAS terminal, the main control unit 120 controls the voltage boosting or stepping down function of the buck/boost converter 101 so that the voltage output through the buck/boost converter 101 is to be suitable for charging the power storage unit 103. In other words, the main control unit 120 controls the buck/boost converter 101 to operate as the buck converter, when the voltage input to the buck/boost converter 101 is higher than the rated voltage of the power storage unit 103, and controls the buck/boost converter 101 to operate as the boost converter, when the voltage input to the buck/boost converter 101 is lower than the rated voltage of the power storage unit 103.

Meanwhile, the plurality of comparators 102, 116, and 112 compares the voltages respectively input from the current transformers 100, 111, and 113 with a reference voltage to output signals corresponding to the voltage differences, namely, comparison signals that indicate voltages generated from the current transformers 100, 111, and 113. The signals are input to the main control unit 120 through the CMP IN terminals.

In the example illustrated in FIG. 2, an induction voltage in the present invention is generated using three current transformers 100, 111, and 113 to allow the comparison signals to be input to the CMP IN terminals, but a person skilled in the art can recognize that the present invention can be adjusted so that only two comparison signals be input to the CMP IN terminals using two transformers.

The main control unit 120 checks whether power is consumed by the load 108 and whether it is currently in the blackout state using the comparison signals input from the CMP IN terminals.

Specifically, in a state in which the power is not blocked to be supplied to the load 108 from the AC power cut-off unit 106, when the current does not flow from the commercial power source 107 to the load 108 and thus, the comparison signals input through the CMP IN terminals have lower voltage levels than the reference signal, but have voltage differences therebetween (i.e., there are phase differences between voltages in the transmission lines), the main control unit 120 determines that it is in an unloaded state in which the power is currently normally supplied from the commercial power source 107 but is not consumed by the load 108.

However, in a state in which the AC power cut-off unit 106 does not block the power from being supplied to the load 108, when the current does not flow from the commercial power source 107 to the load 108, and thus, the comparison signals input through the CMP IN terminals have lower voltage levels than the reference signal, and do not have any voltage difference therebetween (i.e., there is not phase difference between voltages in the transmission lines), the main control unit 120 determines that it is in a blackout state in which the power is not currently supplied from the current commercial power source 107.

When it is currently determined to be in the unloaded state, the main control unit 120 checks the charged state of the power storage unit 103, and when the electrical energy stored in the power storage unit 103 is determined to have a lower level than the reference level set in advance, the main control unit 120 operates the internal electrical energy counter (not shown) in a sleep mode to reduce power consumption, turns off the display included in the transceiver 105 to save power consumption, and turns on or off the communication function of the transceiver 105 in a certain time period to minimize power consumption.

Meanwhile, when it is determined to be currently in the blackout state, the main control unit 120 outputs a blackout signal indicating the blackout state to the transceiver 105 through the interface unit 104, and the transceiver 105 transmits the blackout signal to the electrical energy measurement server (not shown). Thereafter, the main control unit 120 outputs a HALT signal to the interface unit 104, and the interface unit 104 stops supplying the power source voltage SVDD to turn off the transceiver 105 and the display included in the transceiver 105. Then, when the blackout state is released and the power is supplied again from the commercial power source 107, the main control unit 120 controls the interface unit 104 to output the power source voltage SVDD to activate the communication function and the display of the transceiver 105.

In addition, the main control unit 120 measures an electrical energy consumed in the load 108 using the voltage and current measured in the AC power monitoring sensor 110, accumulates and stores the measured electrical energy, and outputs electrical energy measurement data to the interface unit 104, and the interface unit 104 transmits the electrical energy measurement data to the electrical energy measurement server (not shown) through the transceiver 105.

Meanwhile, when a power cut-off instruction is transmitted to the transceiver 105 from the electrical energy measurement server (not shown) on the grounds that a household or company corresponding to the load 108 is in arrears with the electric bill or the like, the transceiver 105 receives the electrical energy cut-off instruction and outputs it to the interface unit 104. The interface unit 104 outputs the power cut-off instruction to a DATA IN terminal of the main control unit 120, and the main control unit 120 outputs an SHALT signal to the power source cut-off unit 106 according to the power cut-off instruction. When receiving the SHALT signal, the power source cut-off unit 106 cuts off power supply from the commercial power source 107 to the load 108.

In the same manner, when a power supply instruction is transmitted to the transceiver 105 from the electrical energy measurement server (not shown), the transceiver 105 receives the power supply instruction and outputs it to the interface unit 104. The interface unit 104 outputs the power supply instruction to the DATA IN terminal of the main control unit 12, and the main control unit 120 controls the power source cut-off unit 106 according to the power supply instruction to restart power supply from the commercial power source 107 to the load 108.

Until now, preferred embodiments of the present invention are described mainly. It will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

The invention claimed is:

1. An electronic electricity meter comprising:
   one or more current transformers for generating power using a magnetic field around a transmission line;
   one or more comparators respectively connected to the transformers, and for outputting comparison signals indicating voltages input from the transformers;
   a buck/boost converter for boosting or stepping down a voltage supplied from any one among the one or more current transformers;
   a power storage unit charged with a voltage output from the buck/boost converter;
   an interface unit driven with a driving voltage VDD supplied from the buck/boost converter or the power storage unit, for generating a driving voltage SVDD of a transceiver to drive the transceiver, outputting data received from an electrical energy measurement server to a main control unit through the transceiver, and for transmitting data received from the main control unit to the electrical energy measurement server through the transceiver;
   the transceiver for transmitting the data input from the interface unit to the electrical energy measurement server, outputting the data received from the electrical measurement server to the main control unit, and including a display for displaying electrical energy; and
   the main control unit for checking the voltage output from the buck/boost converter to control the buck/boost converter to boost or step down the voltage input thereto, receiving the comparison signals from the one or more comparators to determine whether a current state is an unloaded state or a blackout state, and performing a power saving control operation according to the determined current state.

2. The electronic electricity meter according to claim 1, wherein the main control unit checks a charged state of the power storage unit, when the current state is determined to be the unloaded state, and operates an internal electrical energy counter in a sleep mode, turns off a display of the transmitter, and turns on or off a communication function of the transceiver in a constant time period, when the electrical energy stored in the power storage unit has a level equal to or smaller than a reference level preset in advance.

3. The electronic electricity meter according to claim 1, wherein the main control unit, when the current state is the blackout state, outputs a black out signal to the transceiver through the interface unit to allow the transceiver to transmit the black out signal to the electrical energy measurement server, and outputs a HALT signal to the interface unit to allow the interface unit to stop a supply of a driving power voltage SVDD for driving the transceiver so as to turn off the transceiver and the display.

4. The electronic electricity meter according to claim 1, further comprising:
   a power source cut-off unit installed between a commercial power source and a load and for cutting off or resuming power supply from the commercial power source to the load,
   wherein, the main control unit controls the power source cut-off unit to cut off the power supply from the commercial power source to the load side, when a power cut-off instruction is received from an electrical energy measurement server through the interface unit, and controls the power source cut-off unit to resume the power supply from the commercial power source to the load, when a power supply instruction is received from the electrical energy server through the interface unit.

5. The electronic electricity meter according to claim 4, wherein the transceiver receives the power cut-off instruction and the power supply instruction from the electrical energy measurement server or an external electronic device to output the power cut-off instruction and the power supply instruction to the interface unit.

6. The electronic electricity meter according to claim 1, further comprising:
   an AC power monitoring sensor for measuring a voltage and a current of the power flowing from a commercial power source to the load to output a measurement value ACPM; and
   an AC power monitoring unit composed in a structure in which an input side connected to the AC power monitoring sensor and an output side connected to the main control unit are insulated from each other, and for outputting an AC power measurement value ACPM input from the AC power monitoring sensor to the main control unit,
   wherein the main control unit measures electrical energy consumed by the load using the AC power measurement value ACPM, accumulates and stores the measured electrical energy, and outputs electrical energy data to the interface unit to show the electrical energy data on a display included in the transceiver.

7. The electronic electricity meter according to claim 1, wherein the main control unit controls the buck/boost converter to operate as a buck converter, when the voltage input to the buck/boost converter is higher than a rated voltage of the power storage unit, and controls the buck/boost converter to operate as a boost converter, when the voltage input to the buck/boost converter is lower than a rated voltage of the power storage unit.

* * * * *